United States Patent [19]
Said et al.

[11] Patent Number: 5,959,560
[45] Date of Patent: Sep. 28, 1999

[54] DATA COMPRESSION VIA ALPHABET PARTITIONING AND GROUP PARTITIONING

[76] Inventors: Amir Said, 20380 Stevens Creek Blvd., Apt. 208, Cupertino, Calif. 95014-2272; William A. Pearlman, 851 Maxwell Dr., Niskayuna, N.Y. 12309

[21] Appl. No.: 08/796,961

[22] Filed: Feb. 7, 1997

[51] Int. Cl.$^6$ .................................................. H03M 7/00
[52] U.S. Cl. .......................................................... 341/107
[58] Field of Search ............................ 341/95, 107, 106, 341/51, 55, 81, 87; 383/56, 261.2

[56] References Cited

U.S. PATENT DOCUMENTS

| | | | |
|---|---|---|---|
| 4,075,622 | 2/1978 | Lawrence et al. | 340/347 |
| 4,821,119 | 4/1989 | Gharavi | 358/136 |
| 5,049,881 | 9/1991 | Gibson et al. | 341/95 |
| 5,150,209 | 9/1992 | Baker et al. | 358/133 |
| 5,271,071 | 12/1993 | Waite | 382/56 |
| 5,377,018 | 12/1994 | Rafferty | 358/433 |
| 5,535,290 | 7/1996 | Allen | 382/250 |
| 5,539,467 | 7/1996 | Song et al. | 348/402 |

FOREIGN PATENT DOCUMENTS

| | | |
|---|---|---|
| 2 293 734 | 4/1996 | United Kingdom . |
| WO 95/14350 | 5/1995 | WIPO . |

OTHER PUBLICATIONS

G.K. Wallace, "The JPEG Still Picture Compression Standard", Comm. ACM, vol. 34, pp. 30–44, Apr., 1991.

S. Todd, G.G. Langdon, Jr., J. Rissanen, "Parameter reduction and context selection for compression of gray–scale images", IBM J. Res. Develop., vol. 29, No. 2, pp. 188–193, Mar. 1985.

S.D. Stearns, "Arithmetic Coding in Lossless Waveform Compression", IEEE Trans. Signal Processing, vol. 43, No. 8, pp. 1874–1879, Aug. 1995.

A. Said, W.A. Pearlman, "Reversible image compression via multiresolution representation and predictive coding", Proc. SPIE, vol. 2094: Visual Commun. and Image Processing, pp. 664–674, Nov. 1993.

I.H. Witten, R.M. Neal, J.G. Cleary, "Arithmetic Coding For Data Compression", Commun. ACM, vol. 30, No. 6, pp. 520–540, Jun. 1987.

W.B. Pennebaker, J.L. Mitchell, G.G. Langdon, Jr., R.B. Arps, "An overview of the basic principles of the Q–Coder adaptive binary arithmetic coder", IBM J. Res. Develop., vol. 32, No. 6, pp. 717–726, Nov. 1988.

(List continued on next page.)

*Primary Examiner*—Brian Young
*Attorney, Agent, or Firm*—Heslin & Rothenberg, P.C.

[57] ABSTRACT

A data compression method, system and program code are provided which optimize entropy-coding by reducing complexity through alphabet partitioning, and then employing sample-group partitioning in order to maximize data compression on groups of source numbers. The approach is to employ probabilities to renumber source numbers so that smaller numbers correspond to more probable source numbers. This is followed by group partitioning of the stream of resultant numbers into at least two groups, for example, defining regions of an image, ranges of time, or a linked list of data elements related by spatial, temporal or spatio-temporal dependence. A maximum number ($N_m$) is found in a group of numbers of the at least two groups and then entropy-coded. A recursive entropy encoding of the numbers of the group is then employed using the maximum number $N_m$. The process is repeated for each partitioned group. Decoding of the resultant codewords involves the inverse process. Transformation and/or quantization may all be employed in combination with the group-partitioning entropy encoding.

41 Claims, 8 Drawing Sheets

OTHER PUBLICATIONS

A. Said, W.A. Pearlman, "Reduced–Complexity Waveform Coding via Alphabet Partitioning", IEEE Int. Symposium on Information Theory, Whistler, B.C., Canada, p. 373, Sep. 1995.

A. Said, W.A. Pearlman, "A New, Fast, and Efficient Image Codec Based on Set Partitioning in Hierarchical Trees", IEEE Trans. on Circuits and Systems for Video Technology, vol. 6, No. 3, pp. 243–250, Jun. 1996.

A. Said, W.A. Pearlman, "An Image Multiresolution Representation for Lossless and Lossy Compression", IEEE Trans. on Image Processing, vol. 5, No. 9, pp. 1303–1310, Sep. 1996.

DATA COMPRESSION VIA ALPHABET PARTITIONING AND GROUP PARTITIONING

TECHNICAL FIELD

This invention relates to a method, system and program code for data compression/decompression, and more particularly, to a data compression method/system which optimizes entropy coding by reducing complexity through alphabet partitioning and sample-group partitioning in order to maximize data compression on groups of source numbers either with or without degradation of information.

BACKGROUND OF THE INVENTION

Data compression or source coding techniques are useful in reducing the volume of data generated by a source for the purpose of storage or transmission. Economies are realized when the volume of data to be transmitted or stored is decreased. There are two kinds of data compression techniques; namely, information preserving and information degrading. A process is information preserving (lossless) if all the information present before coding can be regenerated after coding. Conversely, a process is information degrading (lossy) if it is irreversible in the sense that the original information cannot be regenerated exactly after the process is performed. An information degrading process can be used when the user of the information is not interested in all the information generated by the source. If the user is only selectively interested in the information, the information degrading coding process can reflect that selectivity. Also, if the user is willing to accept a fidelity criterion, the data may be degraded within certain limits and still remain useful. In general, more data compression can be obtained with information degrading processes than with information preserving processes.

Source coding systems can be classified as statistical or ad hoc, depending on whether or not the system is in some sense optimal in terms of Shannon's noiseless coding theorem. An optimal noiseless coding scheme is one where the average codeword length equals the entropy per symbol of the source. Schemes where the average codeword length achieves or approaches closely the minimum of the entropy are herein referred to as "entropy-coding" schemes. Entropy-coding is well known in the art, e.g., reference A. Gersho and R. M. Gray, *Vector Quantization and Signal Compression*, Kluwer Academic Publishers, Norwell, Mass. (1992). A final classification of source coding systems is the following: if the system accepts digits from the source in fixed length blocks and then generates a variable length sequence of encoded digits, the system is "block-to-variable"; while if the system accepts a variable length sequence of digits from the source and generates a fixed length block of digits, the system is "variable-to-block".

A first optimal coding scheme to be developed was Huffman coding. The technique is block-to-variable. Huffman coding specifies the optimal coding for M messages with probabilities $p_1, p_2, \ldots, p_M$, where $p_i$ is the probability that message "i" is emitted. The least probable message is assigned a codeword containing the longest sequence of bits and more probable messages are assigned codewords of shorter length. In an ideal code, the binary codeword length for message "i" is $\log_2(1/p_i)$. When Huffman coding is applied to a binary source, the source sequence may be broken up into blocks n bits long. Each block then contains one of $M=2^n$ possible messages. For a source with K possible symbols, the number of possible messages in a block of length n is $M=K^n$. As n gets large it becomes impractical to calculate the probability of each message and to generate the corresponding codeword. However, Huffman coding is only optimal as n approaches infinity. Furthermore, this coding scheme requires knowledge of the source statistics and the codewords must be computed a priori. The codewords must be stored in the memory of the encoder and a table look-up is performed on each block. The memory requirements grow exponentially with n. In short, complexity and required knowledge of the source statistics detract from the desirability of Huffman coding.

Another so-called entropy code is the arithmetic code. In arithmetic coding, a long sequence of source symbols is associated with a unique interval of real numbers between 0 and 1. A finite length binary sequence, corresponding to a binary fraction of a number inside that interval, becomes the codeword for the sequence of source symbols. In general, an arithmetic code is slower and harder to implement than a Huffman code, but generally achieves slightly better compression performance for long symbol sequences. In the arithmetic code, a codeword is found by a sequential set of calculations as each symbol from the sequence is received. Therefore, unlike the Huffman code, a codeword is not stored for every possible source sequence. However, the conditional probabilities of the possible current symbols, given the past symbols, must either be calculated or stored beforehand, or a combination thereof, in finding the interval and binary fraction for the particular source sequence. This memory/computation requirement for the arithmetic code is of the same order as the memory requirement of the Huffman code. In general, an arithmetic code is slower and harder to implement than a Huffman code, but generally achieves slightly better compression performance for long symbol sequences.

Run length coding is an ad hoc coding scheme that works well when the probability of a certain symbol from the source is very high (i.e., close to one). In a simple implementation with a binary source, where the probability of a zero is high, the number of consecutive zeroes is counted. When the first "1" is encountered, the number of zeroes is transmitted as a fixed-length block of binary digits. Thus, run length coding is variable-to-block and this fact simplifies the code work considerably. However, the run length digits are not equally probable, and they are often encoded with an entropy code (e.g., Huffman or arithmetic code) to obtain better compression. Also, run length coding is limited by the fact that it is reasonably efficient only when the probability of some source symbol is high and even in this case it is not optimal.

To summarize, the above approaches comprise certain well known source coding schemes, the data compression field, however, is replete with additional coding schemes.

In practical applications of waveform coding, a common rule is that sources have characteristics which continually change. These changes can be easy to identify, like activity in voice coding, or more subtle such as textures and images or instrument timbre in music. The simplest coding methods are known to be ideal under conditions like stationarity, which may be too far from reality. Conversely, there exist many methods for complex sources, e.g., non-stationary, but such methods typically are computationally complex. Frequently, an, exponential growth in complexity makes implementation impractical.

Therefore, an important problem for waveform coding is to devise efficient coding schemes that are highly adaptive, yielding good results for changing source characteristics, and which at the same time have complexity consistent with a particular application, such as real time coding. Many of the most effective algorithms now appearing in the literature employ coding algorithms with intelligent rules for detecting patterns in the source or some form of source state. However, these prior solutions are typically constrained to a single type of source.

Generally, data compression is more efficient as more samples of the source data stream are coupled together. However, the number of possible sequences of sample values grows exponentially with the group size. Even for four samples from a gray-scale image of 256 levels (i.e., the alphabet), the number of distinct sequences of four values (called the alphabet extension) is over four billion, which is too high to be treated by known methods of optimal compression wherein a binary codeword is associated with each one of the possibilities.

Thus, the present invention seeks to provide a novel method for compressing data, and in particular, groups of samples by reducing the number of possibilities through alphabet and sample-set partitioning, while still achieving nearly optimal data compression.

DISCLOSURE OF INVENTION

To briefly summarize, the invention comprises in one aspect a method for compressing data through the encoding of a plurality of integer numbers corresponding to the data. The method includes: employing probabilities to renumber the plurality of integer numbers so that smaller numbers correspond to more probable integer numbers and outputting a stream of numbers based upon the renumbering; partitioning the stream of numbers into at least two groups; finding a maximum number $N_m$ in a group of the at least two groups; entropy-coding the maximum number $N_m$; recursively encoding the numbers of the group using the maximum number $N_m$; and repeating the process for each group of the at least two groups.

In another aspect, a data compression method is provided for coding a plurality of integer numbers representative of the data. The method includes: grouping the plurality of integer numbers into at least two groups; establishing a group list containing the at least two groups; identifying a maximum integer number ($N_m$) within the at least two groups and entropy-coding the maximum integer number; if $N_m>0$, then for each group in the group list, (1) dividing the group into n subgroups, wherein $n \geq 2$, (2) creating a binary mask of n bits, each bit corresponding to one subgroup of the n subgroups and comprising 1 if the corresponding subgroup's maximum integer number ($N_{ms}$) equals the maximum integer number ($N_m$), otherwise the bit is 0, (3) entropy-coding the binary mask and entropy-coding every subgroup maximum number ($N_{ms}$) which is less than the maximum integer number ($N_m$), and (4) adding to the group list each subgroup with more than one integer number and a subgroup maximum integer number ($N_{ms}$)>0; and repeating the entropy-coding stated above for each group and subgroup in the group list until the group list is empty, thereby achieving encoding of the plurality of integer numbers and compression of the data.

An encoder for encoding a plurality of integer numbers is also provided. The encoder comprises processing means for: renumbering the plurality of integer numbers so that smaller numbers correspond to more probable integer numbers, and outputting a stream of numbers based thereon; grouping the stream of numbers into at least two groups; finding a maximum number $N_m$ in a group from the at least two groups; entropy-coding the maximum number $N_m$; recursively encoding the group of numbers using the maximum number $N_m$; and repeating for each group of the at least two groups the finding of a maximum number, entropy-coding, and recursively encoding functions to thereby produce codewords comprising the encoded plurality of integer numbers.

In another aspect, the invention comprises a computer system for processing source numbers. The computer system includes an encoder as outlined above for encoding the source numbers to produce codewords, a transmission/storage subsystem for accommodating the codewords, and a decoder for receiving the codewords from the transmission/storage subsystem and for decoding the codewords to reobtain the source numbers.

In another embodiment, the invention comprises a computer program product comprising a computer usable medium having computer readable program code means for accomplishing the encoding function summarized above.

Enhanced features of each of the above-outlined aspects of the present invention are also described and claimed herein. For example, each aspect has an associated technique for decoding codewords encoded as summarized herein.

To restate, a data compression approach is presented herein for coding a block of samples to a rate per sample lower than first order entropy and closer to the minimum achievable rate than single-sample coding methods. Through limitation of alphabet size, the present invention results in much lower computational complexity and is hence faster and cheaper than other block lossless coding schemes. The present invention exploits dependence between samples in a group by coding the group with minimum size alphabet extensions. By sorting and renumbering according to decreasing probability with increasing value, groups of 0's or 0's and 1's are quickly identified and encoded with a single symbol, leading to very efficient compression. Note that probabilities need not be exact, only order is important. Use of the novel recursive partitioning method of the present invention in conjunction with alphabet partitioning of discrete cosine transform (DCT) or wavelet transform of images produces some of the best results among those previously known for such systems at much lower complexity and hence much faster and cheaper coding and decoding. The data compression approach presented requires no training and requires only a single pass through the sample data. Further, the approach is self-adaptive, generating probability estimates as it passes through the data. These estimates are used for entropy-coding of the mask and alphabet extensions.

Data compression in accordance with the present invention employs both statistical and ad hoc coding methods, combined in a sophisticated adaptive scheme. Part of the invention can be considered an ad hoc coding method by itself, being applied to groups of symbols. The invention also requires, however, statistical entropy-coding methods for coding the individual symbols. The significant innovation is the capability of solving problems of dealing with varying source characteristics and coding several symbols together (thus allowing high-order compression) with a single combined algorithm. This is accomplished by aggregating symbols to be coded in large groups and by applying certain manipulations to those groups, including group subdivision. This subdivision process sorts the symbols roughly according to the source characteristics. Then, using all the information about the statistical distribution of the symbols inside a group (gathered during subdivision), the most effective coding method for the distribution can be selected.

Two other significant features of the invention are an efficient method to convey a large amount of information about the statistical distribution inside a group; and a scheme that is effective to code a few values, and is also effective to code information about groups, and groups of groups, etc. This last property allows the algorithm to be defined and implemented in a concise and efficient manner in recursive form.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

BEST MODE FOR CARRYING OUT THE INVENTION

As briefly noted above, presented herein is a novel low-complexity entropy-coding method/system for coding waveform signals. In accordance with the invention, partitioning is achieved by use of an optional alphabet partitioning method to initially reduce complexity of the entropy-coding process, followed by a new recursive set partitioning entropy-coding process that achieves compression weights smaller than first order entropy even with fast Huffman adaptive codecs. Numerical results from application of the present invention for lossy and lossless image compression show the efficacy of the method presented herein. The method/system presented is comparable to best known methods for data compression.

As used herein, the term "entropy-coding" for a single symbol refers to one of the methods described above under the Background or others, including Huffman, arithmetic, Rice, Lempel-Ziv, etc. The particular choice is not important for the method presented herein to work, provided the coding is used in a proper manner. Thus, only the expression "entropy-coding" is used herein to identify coding pursuant to one of these methods. At the same time, a significant objective of the invention is to allow using fast, low-complexity methods for the symbol-coding task.

Figure 1:
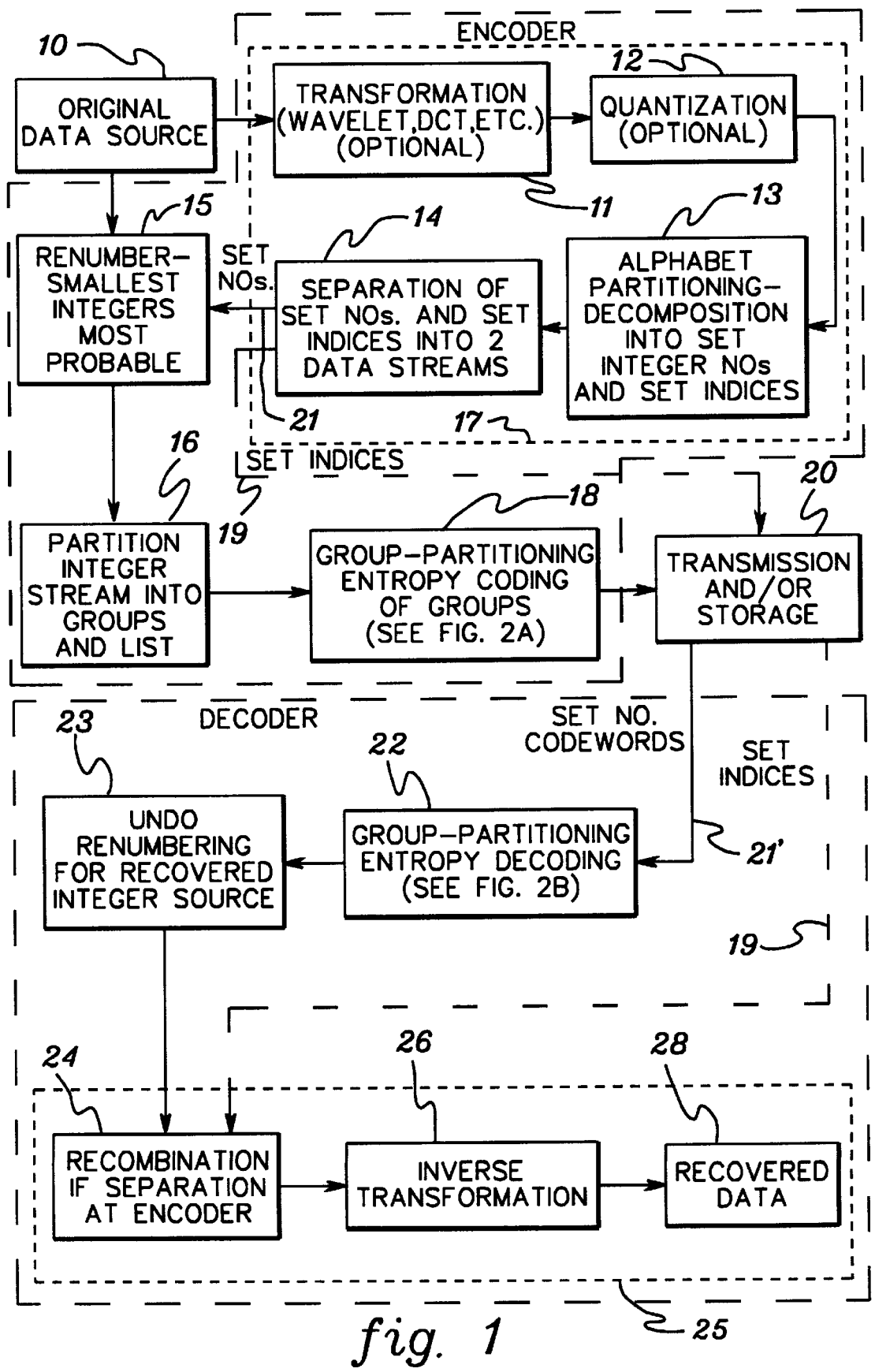
FIG. 1 is a general block diagram generally illustrating an encode and decode process in accordance with the present invention.

FIG. 1 depicts a general embodiment of an encoding/decoding method/system in accordance with the invention. An original data source 10, such as image, video, audio, speech, etc. data, provides source data to a renumber process 15, either directly or through optional processing 17 (which may include use of alphabet partitioning). Optional processings 17 are first discussed below.

Most data compression approaches employ transformation of data using one of a number of available approaches, e.g., linear prediction, discrete cosine transformation (DCT), wavelet, pyramids, etc. Transformation 11 can optionally be followed by a quantization 12. Further, quantization can occur either on the original source data or on a transformation 11 output. Quantization 12 produces an approximation of the data by a smaller finite set of values which can be uniquely associated with a set of integer numbers. Output of quantization 12 is either directly to renumber process 15 or to alphabet partitioning process 13 and subsequent separation process 14. Alphabet partitioning is next discussed below.

In practical waveform coding applications (e.g., image, video, audio) the data to be entropy-coded has a distribution that is simultaneously highly peaked and very long tailed. Typically, the values are concentrated near zero. But there is also a significant number of values with very large magnitude. This means that large compression ratios are possible, but the coding process must deal with a very large alphabet. This coding problem occurs for both lossy and lossless compression.

There are many practical difficulties when a data alphabet is large, ranging from the time required to design and implement the code, to the amount of memory necessary to store codebooks or gather data statistics (i.e., when the coding method is adaptive). These problems become worse if the statistical dependence is exploited between the source numbers by, for example, coding several numbers together or designing conditional codes.

Several ad hoc methods have been devised to deal with the problem caused by large alphabets. For instance, a popular method uses an extra "overflow" symbol to indicate data that is to be coded with a special method. However, these methods are not very efficient and have limited application.

Presented herein is an alphabet partitioning method to reduce the coding complexity when the source alphabet is large. This is based on the following strategy:

the source alphabet is partitioned into a relatively small number of groups or sets;

each symbol is coded in two steps: first the number of the set in which the symbol belongs (called set number) is coded; afterwards the number of that particular source symbol inside that set (the set index) is coded; and when coding the pair (set number, set index) the set number is entropy-coded with a powerful method in accordance with the present invention, while the set index is coded with a simple and fast method (which might be the binary representation of that index).

FIG. 1 shows a separation process 14 where set indices 19 are separated from and handled differently than set numbers 21. The set indexes are left uncoded. Note that even though a waveform source may be mentioned in connection with alphabet partitioning, it is possible that the data source to be coded comprises the output of transformation 11 or quantization 12.

The advantage of alphabet partitioning comes from the fact that it is normally possible to find partitions that allow large reductions in coding complexity with small loss in compression efficiency. Methods that fit in this general strategy have already been used in several compression schemes. For example, such a method is used inside the popular compression program gzip, and also in the JPEG still picture lossless compression standard (see G. K. Wallace, "The JPEG still picture compression standard," *Comm. ACM*, vol. 34, pp. 30–44, April 1991), in its variable-length-integer (VLI) representation. It has been used for complexity reduction in the context definitions for arithmetic coding (see S. Todd, G. G. Langdon, Jr., and J. Rissanan, "Parameter reduction and context selection for compression of gray-scale images," *IBM J. Res. Develop.*, vol. 29, pp. 188–193, March 1985), and also in the arithmetic coding of waveforms (S. D. Stearns, "Arithmetic coding in lossless waveform compression," *IEEE Trans. Signal Processing*, vol. 43, pp. 1874–1879, August 1995). Even though the technique of alphabet partitioning has been employed before, most implementations are truly ad hoc, without any attempt to optimize its implementation, or even analysis of the possible loss. Since this is not common knowledge, and few if any references exist on the subject, an analysis is presented herein.

Presented below is an analysis of the trade-off between coding/decoding complexity and compression efficiency, and also an approach to find the best partitions for a given source distribution. With the complexity reduction achieved by the alphabet partitioning method presented, it is shown that it is feasible to use more powerful entropy-coding methods, and to exploit statistical dependencies which cannot be exploited by linear prediction methods. Numerical results make clear the advantages of alphabet partitioning for practical problems.

Another practical advantage is related to error protection. An error in a variable-length code can have disastrous consequences. With the alphabet partitioning scheme presented, the set-index data can be left uncoded, meaning that an error in that data has very limited consequences (i.e., a single bit error will change only one reconstructed source number or symbol).

Analysis of Alphabet Partitioning

Assume an i.i.d. source with M symbols, where the symbol i occurs with probability $p_i$. Its entropy is $$H = \sum_{i=1}^{M} p_i \log_2\left(\frac{1}{p_i}\right) \quad (1)$$

Next, partition the source symbols or numbers into non-empty sets $S_n$, n=1,2, . . . ,N, and denote the number of symbols in $S_n$ by $M_n$.

Then consider an ideal entropy-coding method which first codes the set in which the source symbol belongs (i.e., the set number), and later codes the symbol conditioned that it belongs to that set (i.e., the set index). The coding rate, here equal to the combined entropy, is $$H_1 = \sum_{n=1}^{N} P_n \log_2\left(\frac{1}{P_n}\right) + \sum_{n=1}^{N} P_n \sum_{i \in S_n} \frac{p_i}{P_n} \log_2\left(\frac{P_n}{p_i}\right) \quad (2)$$

$$= \sum_{n=1}^{N} P_n \log_2\left(\frac{1}{P_n}\right) + \sum_{n=1}^{N} \sum_{i \in S_n} p_i \log_2\left(\frac{P_n}{p_i}\right),$$

where:

$$P_n = \sum_{i \in S_n} p_i, \quad (3)$$

is the probability that a data symbol belongs to set n.

The first term in equation (2) is the rate to code the set, and the second term is the rate to conditionally code the symbol index in the set. The substitution of equation (3) in equation (2) gives $$H_1 = \sum_{n=1}^{N} \sum_{i \in S_n} \left[ p_i \log_2\left(\frac{1}{P_n}\right) + p_i \log_2\left(\frac{P_n}{p_i}\right) \right] \quad (4)$$

$$= \sum_{n=1}^{N} \sum_{i \in S_n} p_i \log_2\left(\frac{1}{p_i}\right)$$

$$= \sum_{i=1}^{M} p_i \log_2\left(\frac{1}{p_i}\right) = H.$$

Thus, the combined rate is equal to the source entropy, which means that there is no loss in separating the coding process in two steps. This is intuitively reasonable, since the pair (set number, set index) is related to the symbol number by a one-to-one mapping.

To reduce complexity, all indexes of the set $S_n$ are coded with the same number of bits, $\log_2 M_n$. If $M_n$ is a power of two, then the set indexes can be coded using their binary representation. When arithmetic coding (see, e.g., I. H. Witten, R. M. Neal, and J. G. Cleary, "Arithmetic coding for data compression", *Commun. ACM*, vol. 30, pp. 520–540, June 1987, and W. B. Pennebaker, J. L. Mitchell, G. G. Langdon Jr., and R. B. Arps, "An overview of the basic principles of the Q-coder adaptive binary arithmetic coder", *IBM J. Res. Develop.*, vol. 32, pp. 717–726, November 1988) is used, complexity reduction can still be achieved even if $M_n$ is not a power of two, because it is easier to code assuming a uniform distribution.

Of course, there is a penalty for assigning $\log_2 M_n$ bits for every symbol in the set $S_n$ since the optimal number of bits to be used by symbol i inside set $S_n$ is $\log_2(P_n/p_i)$. To evaluate the loss, the combined rate of the simplified method can be calculated which is the entropy of the set numbers plus an average of the fixed rates used to code the set indexes:

$$H_2 = \sum_{n=1}^{N} P_n \left[ \log_2\left(\frac{1}{P_n}\right) + \log_2 M_n \right] \quad (5)$$

$$= \sum_{n=1}^{N} P_n \log_2\left(\frac{1}{P_n}\right) + \sum_{n=1}^{N} \sum_{i \in S_n} p_i \log_2 M_n.$$

From equations (2) and (5) it follows that the difference between $H_2$ and $H_1$ is $$\Delta H = H_2 - H_1 = \sum_{n=1}^{N} \sum_{i \in S_n} \left[ p_i \log_2 M_n - p_i \log_2\left(\frac{P_n}{p_i}\right) \right] \quad (6)$$

$$= \sum_{n+1}^{N} \sum_{i \in S_n} p_i \log_2\left(\frac{M_n p_i}{P_n}\right).$$

Analysis of equation (6) leads to the conclusion that the relative loss $\Delta H/H$ can be made very small if the alphabets are partitioned in sets such that:

1. $P_n \log_2 M_n/H$ is very small, i.e., the relative contribution of $S_n$ to $H$ is very small.
2. $p_i \approx P_n/M_n$, $\forall i \in S_n$, i.e., the distribution inside $S_n$ is approximately uniform.

The first condition exploits the fact that some symbols can occur with very low probability, a property that has been used by several other methods. The second condition, on the other hand, can occur even for the most probable symbols. What makes the alphabet partitioning scheme really effective is the simultaneous exploitation of these two very different conditions.

Note that the analysis above can be easily extended to conditional entropies by simply replacing the probabilities with conditional probabilities.

Discussed above are the conditions necessary to have good alphabet partitions. It is still necessary to define an efficient method to construct the optimal partitions. The objective is to minimize complexity while maintaining a relatively small loss in compression efficiency. Thus, the optimization problem can be expressed as: minimize the number of sets N, subject to $\Delta H \leq \epsilon H$, where $\epsilon$ is a small number (e.g., 0.01).

Other practical constraints also need to be considered. For instance, if the set indexes are to be left uncoded, then the number of set elements, $M_n, n=1,2,\ldots,N$, must be a power of two. When using an arithmetic code it may not be possible to separate the data streams with the set numbers and the set indexes, and the constraint above is not necessary.

The alphabet partitioning problem is a combinatorial problem. The optimization methods to solve that type of problem are complex and require a large computational effort to find the optimal solution. Another alternative is to use heuristic methods, which have been successfully employed to solve combinatorial problems. They can find, in the majority of cases, solutions that are very near optimum. The disadvantage is that the user may not know with certainty the quality of the solution, but this may not be a problem for engineering applications.

With the above as background, the following fast heuristic algorithm is proposed for use "on-the-fly" to find good partitions.

1. Set $\Delta H=0$; choose N relatively large and the alphabet partitions $S_n$ using an empirical rule (see comment below); choose the maximum relative loss $\epsilon$.
2. For every pair of sets with the same size, join the sets, calculate the entropy variation $\delta H$, and select the smallest variation $\delta H^*$.
3. If $\delta H^* + \Delta H > \epsilon H$ then stop.
4. Otherwise
   (a) Set N←N−1, $\Delta H \leftarrow \Delta H + \delta H^*$
   (b) replace the sets corresponding to $\delta H^*$ by their union
   (c) go to step 2.

This algorithm belongs to a class of heuristics called "greedy," because its decisions do not take into account the future alternatives, and when a decision is chosen it cannot be undone.

In step 1 of the algorithm an initial solution is required. With some knowledge of the source and some experience with the algorithm it is easy to identify good initial solutions. For instance, with transformed waveforms positive and negative values with the same probability are common. Thus, as shown by equation (6), there is absolutely no loss in joining the positive and negative values in the same sets. This is equivalent to saying that there is no gain in attempting to entropy-code the sign bits. Furthermore, the difference in probabilities tend to get smaller for larger values. For example, the values 2 and 5 can have very different probabilities, while the values 82 and 85 should have practically the same probability, and thus can be put together in the same set.

An example of a good initial solution for image sources is shown in Table 1. In that example the value is decomposed in three parts: a magnitude set, which corresponds to the set number, and a group of sign and magnitude-difference bits required to code the set index (amplitude intervals).

TABLE 1

| magnitude set (MS) | amplitude intervals | sign bit | magnitude-difference bits |
|---|---|---|---|
| 0 | [0] | no | 0 |
| 1 | [−1], [1] | yes | 0 |
| 2 | [−2], [2] | yes | 0 |
| 3 | [−3], [3] | yes | 0 |
| 3 | [−4], [4] | yes | 0 |
| 4 | [−6,−5], [5,6] | yes | 1 |
| 5 | [−8,−7], [7,8] | yes | 1 |
| 6 | [−12,−9], [9,12] | yes | 2 |
| 7 | [−16,−13], [13,16] | yes | 2 |
| . | . | . | . |
| . | . | . | . |
| . | . | . | . |

Although preferred in many instances, alphabet partitioning in accordance with the description provided above is not a requirement for the group-partitioning approach described hereinbelow in accordance with the present invention. Thus, with reference to FIG. 1, alphabet partitioning 13 and subsequent separation 14 processings are regarded as optional. If, however, alphabet partitioning is employed, then only set numbers 21 need be entropy-coded in accordance with the present invention. These set numbers will comprise a relatively small alphabet, for example, 16 integer numbers.

Presented herein below is a novel partitioning method which applies to sets or groups of integer numbers. The general approach is to separate the integer numbers according to statistical distribution, i.e. probability, and to code each group accordingly. Thus, renumber processing 15 of FIG. 1 directs that all integer numbers are renumbered, if necessary, so that the most probable numbers are the smallest numbers, i.e., zero is most probable, one next most probable, etc. The resulting stream of integers then undergoes partition processing 16 to divide the integer stream into groups, which are accumulated in a group list. The groups are determined by spatial, temporal or spatio-temporal proximity. Grouping is based on the fact that numbers with the same distribution tend to occur in "clusters", which depend on the type of source. For example, with images, two-dimensional spatial regions are defined, while for audio, a time range can be represented, or a two-dimensional region in a time-frequency range can be used. The groups are put into a group list and tagged by identifiers.

Figure 2A:
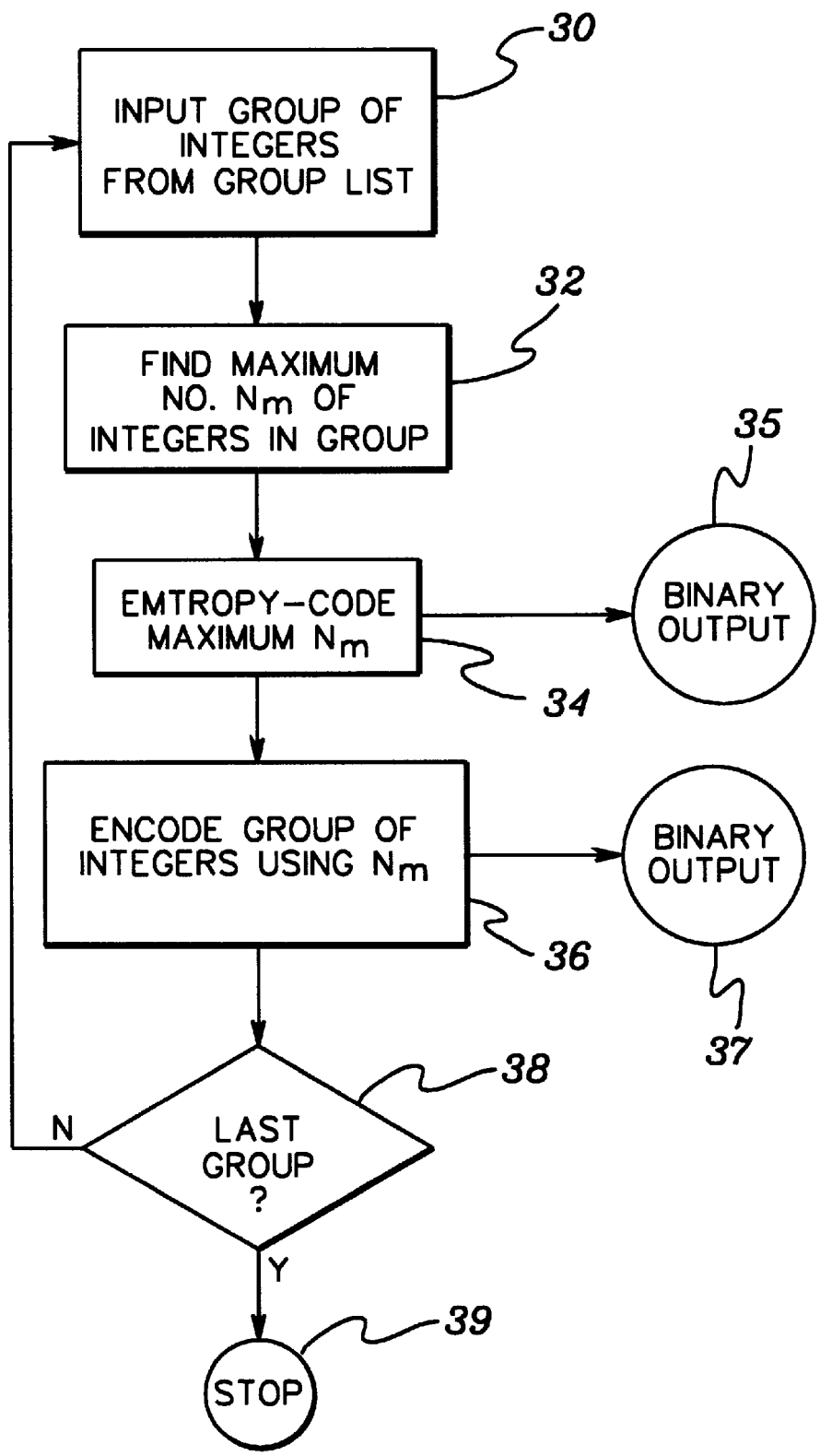
FIG. 2a is a flowchart of one embodiment of group-partitioning entropy coding in accordance with the present invention.

After grouping the integers, each group of integers undergoes group-partitioning entropy-coding process 18, one embodiment of which is depicted in FIG. 2a. After coding the groups of integers, the resultant codewords are transmitted and/or stored 20.

As noted, FIG. 2a presents one embodiment of group-partitioning entropy-coding in accordance with the present invention. The process begins with selection of a group of integers from the group list 30. Next, the maximum group integer number $N_m$ is found 32 and entropy-coded 34. The resultant codeword comprises a binary output 35 to be transmitted and/or stored at process 20 (FIG. 1).

Next, the group of integers is encoded using the maximum integer number $N_m$ by recursive set partitioning 36, alternate embodiments of which are presented in FIGS. 3 & 5 which are described below. Binary output 37 from encoding process 36 is forwarded for transmission and/or storage 20 (FIG. 1). After encoding the group of integers using the maximum integer number $N_m$, processing inquires whether the encoded group comprises the last group in the group list 38. If "no", then a next group from the group list is obtained, along with the group identifier, and the processing of FIG. 2a is repeated. If the encoded group comprises the last group, then group-partitioning entropy-coding of the groups is complete 39.

Continuing with FIG. 1, decoding is performed after transmission and/or storage of the codewords 21', which if alphabet partitioning 13 and subsequent separation 14 have been employed, comprise set number codewords 21 and corresponding set indices 19 in binary form. If alphabet partitioning and separation are not employed, then codewords 21' comprises the encoded integer numbers and set indices 19 would not be present. Codewords 21' undergo group-partitioning entropy-decoding 22 to decode the groups of integers. Group-partitioning entropy-decoding is depicted in FIG. 2b.

Figure 2B:
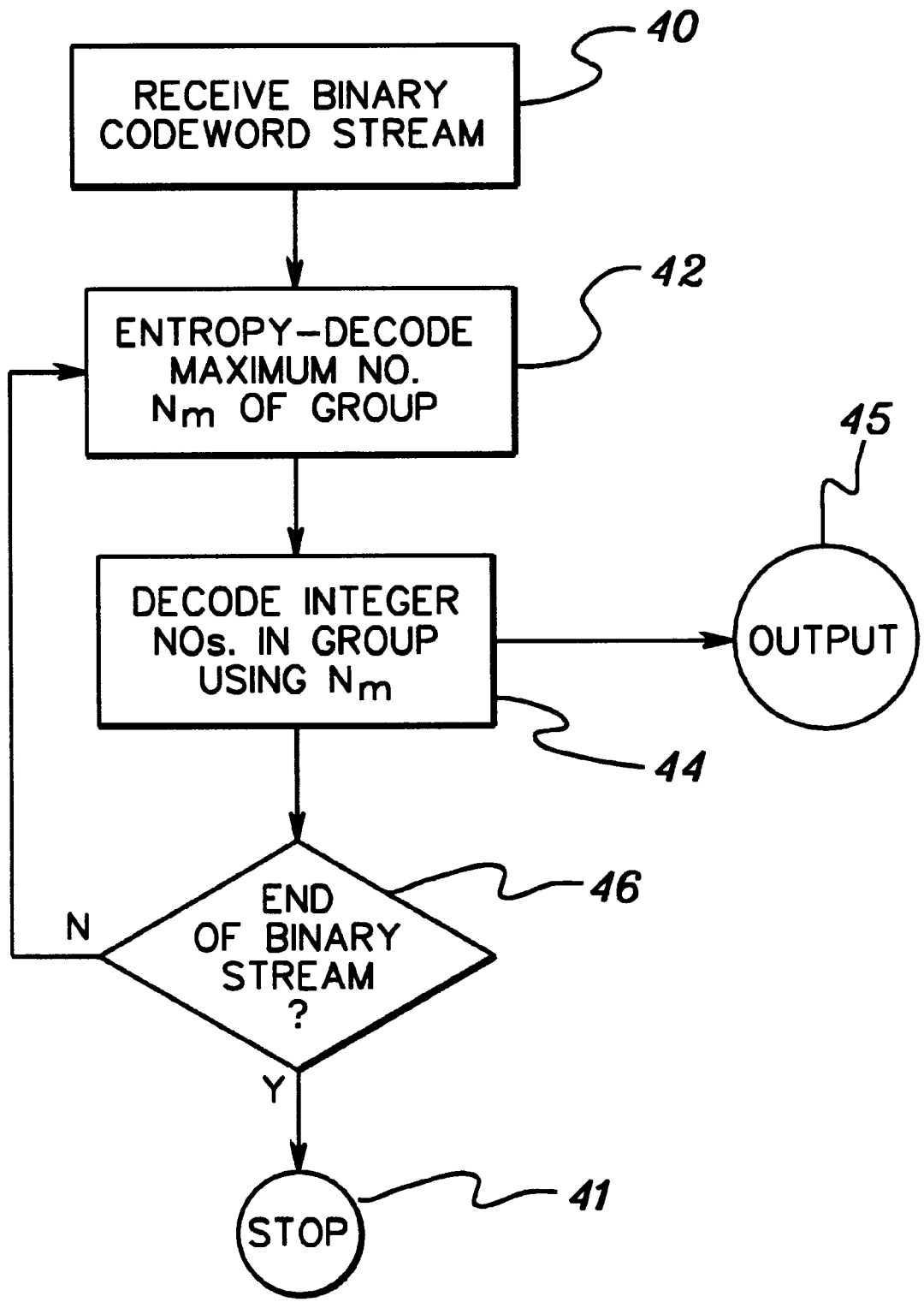
FIG. 2b is a flowchart of one embodiment of group-partitioning entropy decoding in accordance with the present invention.
Figure 4:
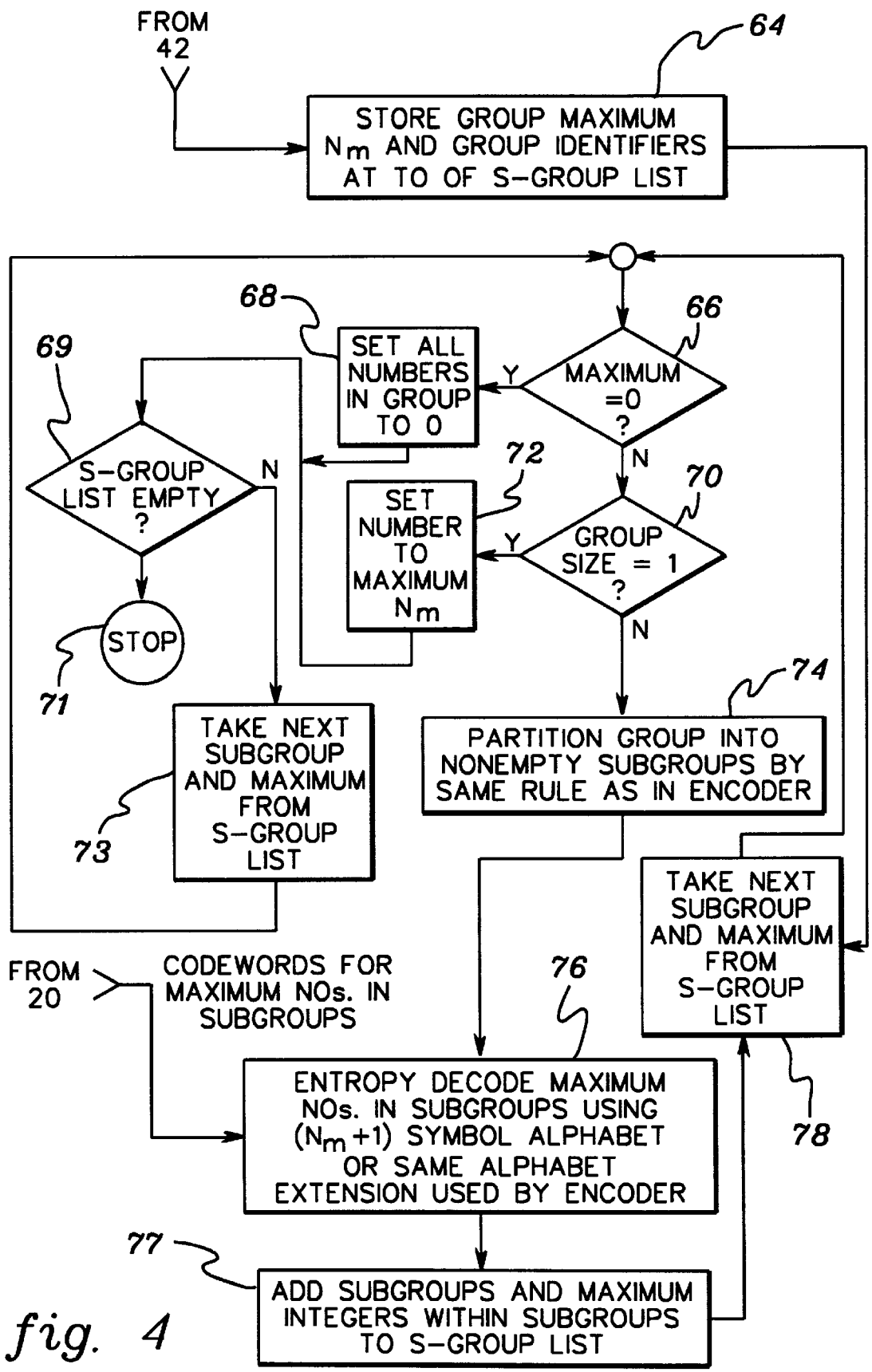
FIG. 4 is a flowchart of one embodiment of a decode process pursuant to the present invention for decoding integer numbers in a group encoded using the process of FIG. 3.
Figure 6:
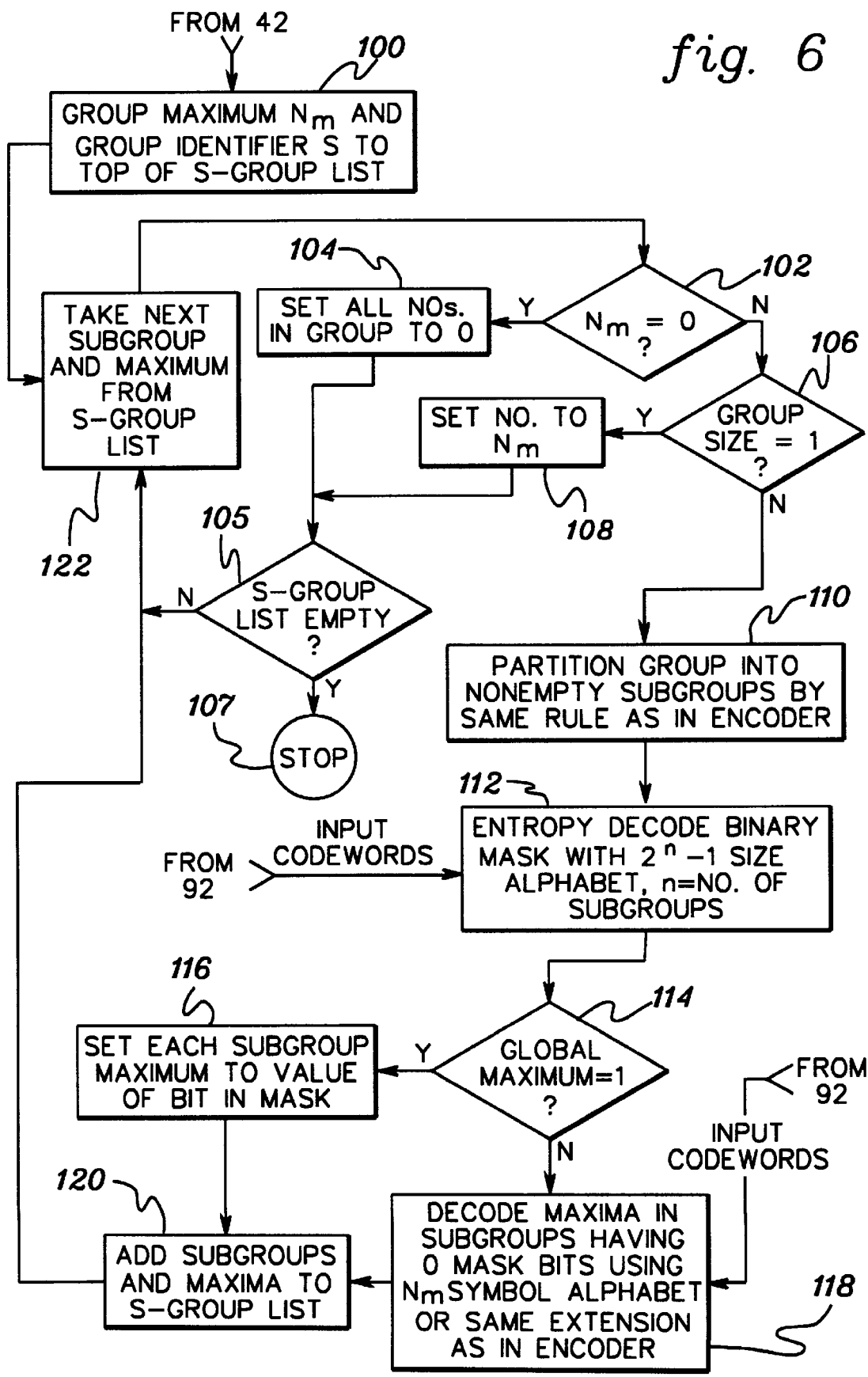
FIG. 6 is a flowchart of an alternate decode process embodiment for decoding groups of integer numbers in a group encoded using the process of FIG. 6.

Referring to FIG. 2b, after receiving the binary codeword stream 40, entropy-decoding of the maximum number $N_m$ of the group 42 is completed, and subsequent to obtaining the maximum integer number $N_m$, the integer numbers in the group are decoded using the maximum integer number $N_m$ 44. The maximum integer number of the group indicates the size of the alphabet or extension. Note that the ordering of groups formed at the encoder is assumed to be known at the decoder. Alternate embodiments for decode processing 44 are depicted in FIGS. 4 & 6 and described in detail further below. If the binary input to the decode process is not exhausted, then from inquiry 46, processing returns to process 42 to entropy-decode the maximum number $N_m$ of the next group. Once the end of the binary stream is reached, processing is terminated 41.

Output 45 from integer number decode process 44 is to renumber processing 23 of FIG. 1. Renumber processing 23 undoes the renumbering accomplished by renumber process 15. Undoing renumbering is possible since probabilities are assumed known. If alphabet partitioning and subsequent separation of set numbers and set indices is employed, then the decoding scheme of FIG. 1 further requires the optional processings 25 of recombination 24 and inverse transform 26 to obtain the recovered data 28. Otherwise, upon undoing the numbering at process 23, the recovered data is obtained. In recombination process 24, the integer numbers within the groups (i.e., set numbers) are recombined with the set indices, again assuming that decomposition occurred at the encoder. After recombining the data, inverse transformation 26 occurs if transformation 11 was employed at the encoder. Again, both recombination 24 and inverse transform 26 are optional depending upon the encoding process employed.

Figure 3:
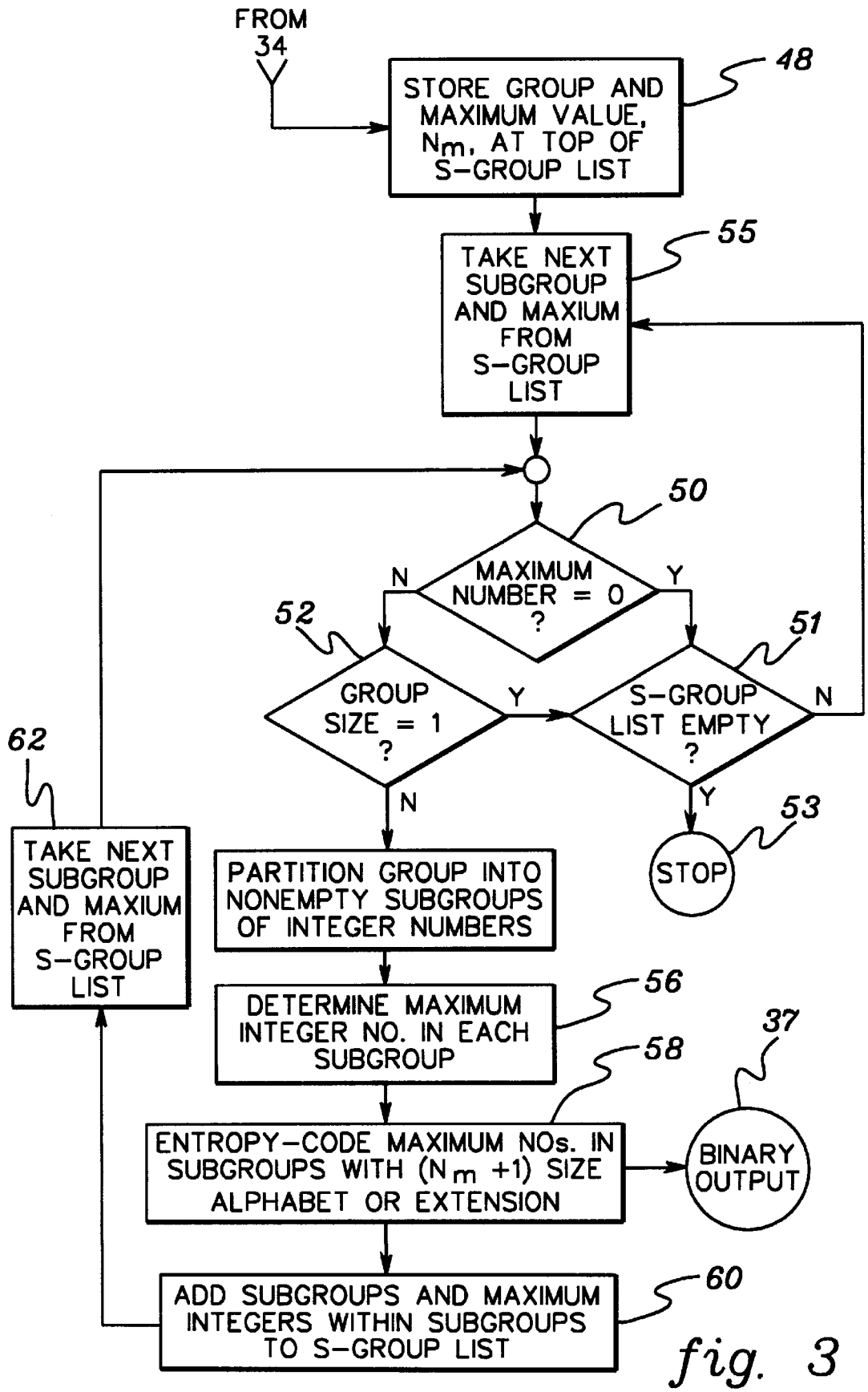
FIG. 3 is a flowchart of one embodiment of a process for encoding groups of integers using a maximum integer number $N_m$ in the group in accordance with the present invention.

As noted, one approach to recursive group-partitioning entropy-encoding process 36 of FIG. 2a is depicted in FIG. 3. Initially, the group of integers and maximum value $N_m$ from processing 34 (FIG. 2a) is received and stored in a subordinate group (S-group) list 48. The next (or largest) group in the S-group list and its maximum integer $N_m$ are now taken together and removed from the list 55. The group's maximum integer number $N_m$ just removed from the list is tested to determine whether all integers in the group equal zero 50. If "yes", processing next inquires whether the sub-group list is empty 51. If "yes" again, processing terminates 53. Otherwise, the next subgroup and maximum in the S-group list are obtained 55 and processing returns to inquiry 50.

Assuming that the maximum number in the group is other than zero, inquiry is made whether the group size equals one 52. If the group size equals one, then processing stops since that single integer is known to be the maximum integer number $N_m$. Processing then inquires whether the subordinate group list is empty 51. If "yes", processing terminates 53, otherwise the next subgroup and maximum in the S-group list is obtained 55 and processing returns to inquiry 50. If the group size is greater than one, then processing partitions the group into nonempty subgroups of integer numbers 54. A maximum integer number within each subgroup $N_{ms}$ is next determined 56. Since the maximum integer number in each subgroup $N_{ms}$ cannot exceed the maximum integer number $N_m$, the number of possible values (i.e., alphabet size), of the subgroup integer maxima cannot exceed $N_m+1$. (The alphabet is $0+N_m$ integers.) Therefore, the subgroup integer maxima $N_{ms}$ may be entropy-coded individually with an $N_m+1$ size alphabet or its extension alphabet obtained by aggregating multiple subgroup integer maxima $N_{ms}$. An extension is preferred if its size is sufficiently small. Output from entropy-coding 58 comprises binary output 37 (FIG. 2a), which as noted above, is forwarded for transmission and/or storage 20 (FIG. 1). The coding using different alphabets is normally accomplished using different models for adaptive encoders. This way, for each alphabet size, the encoder will automatically count the distribution of symbols and select the optimal codewords accordingly.

The power of the method presented herein resides within entropy-coding step 58 and its repeated use. This is because:

(1) The maximum of a group of numbers is known, so that size of the alphabet is reduced from the original;

(2) If the size of the group and the alphabet size together determine an extension of reasonable size, then coding efficiency increases by aggregating numbers and using the extension;

(3) Since the maximum gives a good indication of the type of distribution inside the group, and since one alphabet and (possibly adaptive) entropy-coding is used for each value of the maximum, each group number will be coded using a codec selected for that distribution, that is, the coding is strongly conditioned, and the maximum is the conditioning context;

(4) Since groups are repeatedly partitioned and small maximum integers of groups are the most probable, aggregation and extension use can be frequently employed, resulting in high coding efficiency; and (5) Large groups of 0's, which occur most often for a transform data source, can be quickly located and coded with a single symbol. In order to obtain codes of minimum average length, the most probable integers or groups of integers must have the smallest length codewords. The method presented automatically assigns the shortest codewords to the most probable symbols, often in large aggregations.

After entropy-coding the maximum numbers in the subgroups with the $N_m+1$ size alphabet, or extension 58, processing adds the subgroups, their identifiers and the maximum integers to the S-group list 60 and the next group or subgroup, along with the corresponding maximum integer number therein, is obtained 62 and the processing of FIG. 3 is repeated beginning with inquiry 50. Thus, the groups are repeatedly divided into smaller subgroups until the maximum integer number in the subgroup is 0 or the subgroup has size one (i.e, one constituent).

FIG. 4 depicts one embodiment of recursive group partitioning decoding (process 22 of FIG. 1) when the group-partitioning entropy-encoding process of FIG. 3 has been employed. Processing begins with storing of the group maximum integer number $N_m$ and group identifiers within a subordinate-group list 64. The next or largest group in the subordinate group (S-group) list and its maximum integer are now taken together and removed from the S-group list 78. Inquiry is made whether the maximum integer number $N_m$ just removed from the S-group list is zero 66. If "yes", then all numbers in the group are set to zero 68 and processing inquires whether the S-group list is empty 69. If "yes", processing terminates 71. Otherwise, the next group and maximum in the S-group list is obtained 73 and processing returns to inquiry 66.

Assuming that the maximum number is greater than zero, then inquiry 70 determines whether the group size is one. If group size is one, then the integer number in the group comprises the maximum integer number $N_m$ 72 for the group and processing inquires whether the S-group list is empty 69. If so, processing stops 71. Otherwise, the next group and maximum in the S-group list are obtained 73 and processing returns to inquiry 66. If the size of the group is greater than one, then the group is partitioned into nonempty subgroups 74. This is accomplished by the same partitioning method used in the encoder. Since the maximum integer numbers $N_{ms}$ in the subgroups are identified, codewords for the subgroup maxima received from the encoder (via step 20 of FIG. 1) are decoded using the known symbol alphabet of size ($N_m+1$) or its extension, as employed in the encoder 76. Subgroups and maxima are then added to the S-group list 77, following the processing of the encoder. The procedure is then repeated for the next group or subgroup in the S-group list 78 beginning with inquiry 66. Thus, the groups and subgroups are repeatedly partitioned and the maxima are decoded until a group or subgroup has a maximum of zero, in which case all constituents are zero, or has only one constituent, with the integer number of the constituent being the maximum integer number.

Figure 5:
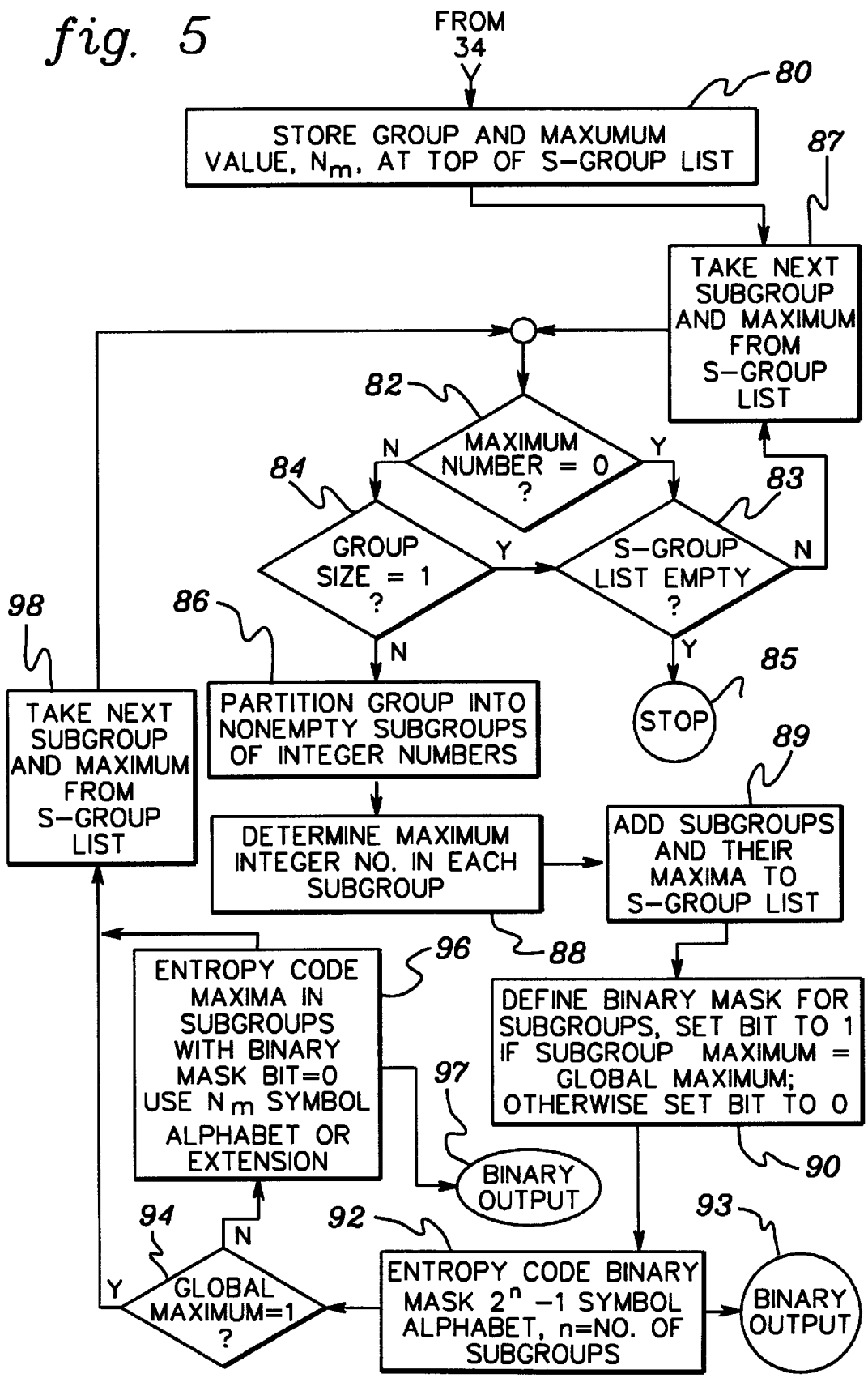
FIG. 5 is a flowchart of an alternate embodiment of a process for encoding groups of integers using the maximum integer $N_m$ in accordance with the present invention.

FIG. 5 depicts an alternate embodiment of a recursive group-partitioning entropy-encoding in accordance with the present invention wherein a binary mask is employed, while FIG. 6 depicts a corresponding decoding process using a binary mask. Beginning with FIG. 5, the group integer numbers and identifiers are accepted, and a maximum number $N_m$ is identified and placed at the top of an S-group list 80. The next (largest) group in the S-group list and its maximum integer $N_m$ are now taken together and removed from the list 87. The maximum integer number $N_m$ of the group just removed from the list is then examined 82. If the maximum $N_m$ is zero then processing inquires whether the S-group list is empty 83 and if "yes", then stops 85. Assuming that the S-group list is nonempty, then the next subgroup and maximum in the list are obtained 87 and processing returns to inquiry 82. If, on the other hand, the maximum number is other than zero, then the group size is determined 84. If the group size is one, then processing again determines whether the S-group list is empty 83. If so, processing terminates 85; otherwise, the next subgroup and maximum in the list are obtained 87 and processing returns to inquiry 82. If there is more than one constituent in the group, the group is partitioned into nonempty subgroups of integer numbers 86. A maximum integer number $N_{ms}$ is then determined for each subgroup 88 and the subgroups and their maxima are added to the S-group list 89.

In accordance with this embodiment, a binary mask is defined for each subgroup 90. This mask is defined such that if the group maximum equals the global maximum integer number $N_m$, then a corresponding bit in the mask is set to one, otherwise the group bit is set to zero. The binary mask is then entropy-coded 92. If there are n subgroups, and therefore n bits in the mask, there are $2^n-1$ possible different masks. The mask of all 0's cannot occur because at least one subgroup integer must equal the maximum. The entropy-coding of the mask requires at most an alphabet of size $2^n-1$. The binary code stream for the mask is output 93 for transmission and/or storage (ultimately to be decoded in process step 112 of FIG. 6 decoding).

Once the binary mask is entropy-coded, inquiry is made whether the global integer number $N_m$ equals one 94. If the global maximum integer number $N_m$ is greater than one, then entropy-code the maximum integers in those subgroups whose mask bit is zero 96. (When the mask bit is one, the subgroup maximum is known to be the maximum integer number $N_m$.) This coding of maximum integers in subgroups with mask bits of zero requires an alphabet size of $N_m$ or its extension obtained by aggregating the subgroup maximum integers. Note the contrast to the method of FIG. 3 which does not employ a binary mask. The alphabet size is one less and the aggregation is fewer in number since only integers less than the global maximum need to be aggregated. Once entropy-coding of the maxima in the subgroups is completed, or if the global maximum integer number $N_m$ is one, a next subgroup and maximum integer number in the subordinate group (S-group) list is obtained 98 and the encode processing repeats beginning with inquiry 82. Note from the above discussion that the subgroups are repeatedly partitioned into smaller and smaller subgroups until the maximum integer number is zero or the subgroup has only one constituent.

As noted, FIG. 6 depicts a recursive group-partitioning decoding process employed when encoding employs a binary mask. The group maxima integer number $N_m$ is received and input (along with a group identifier) at the top of the subordinate group (S-group) list 100. Both the encoder and the decoder know the order in which groups are processed. The next (largest) group in the S-group list and its maximum integer $N_m$ are now taken together and remove from the S-group list 122. Then, inquiry is made whether the maximum integer $N_m$ just removed from the list equals zero 102. If yes, then all numbers in the group are set to zero 104 and processing inquires whether the S-group list is empty 105. If "yes" again, processing stops 107. Otherwise, the next subgroup and maxima in the S-group list is obtained 122 and processing returns to inquiry 102. If the maximum integer number is greater than zero, then inquiry is made whether the group size is one 106. If there is only one constituent in the group, then its integer number is set to the maximum integer number $N_m$ 108; and inquiry is made whether the S-group list is empty 105. If "yes", processing terminates 107. Otherwise, the next subgroup and maximum in the S-group list are obtained 122 and processing returns to inquiry 102. If the group size is greater than one, then the group is partitioned into nonempty subgroups by the same rules used by the encoder 110.

Next, the codewords of the binary mask are received and entropy-decoded with a $2^n-1$ size alphabet, where n is the known number of subgroups 112. The ordering of bits in the mask corresponds to the ordering of subgroups, which agree by design in both the encoder and decoder. Inquiry is then made whether the maximum integer number $N_m$ equals one 114. If "yes", then the mask bits and maximum integers of the subgroups are the same value so each subgroup maximum integer number $N_{ms}$ is set to its bit value in the mask 116. If the global maximum integer number $N_m$ is greater than one, then the codewords of the subgroup maxima from the encoder output 97 (FIG. 5) are received and decoded 118. Since the maximum integer number $N_m$ is known, the choice of the alphabet of size $N_m$ or its extension points to the appropriate decoder. The association of these maximum integers to their subgroups is given through the zero bits of the now decoded binary mask. The subgroups and maxima determined in process steps 116 or 118 are added to the S-group list 120 and a next subgroup and maxima integer number in the S-group list is obtained 122. The procedure is then repeated beginning with inquiry 102. Thus, the subgroups are repeatedly partitioned and maxima are decoded using binary codewords from the encoder (received through the transmission medium and/or storage) until the maximum integer number in a subgroup is zero or a subgroup has only one constituent. Various examples of processing in accordance with the present invention are next provided.

Groups of 4×4 Image Pixels

In an image coding example, assume that groups of 4×4 pixels are to be coded, each one of which is 16 set numbers. Also assume that the numbers are sorted according to their probabilities, with "0" representing the most common, "1" the second most common, etc.

Consider using a first extension, and code groups of two pixels with a 256-symbol alphabet, which is a reasonable size. If a second or third extension is to be used, alphabets with 4,096 or 65,536 symbols, respectively, are needed which may be too large. However, the vast majority of the extension numbers are expected to be all "0", leading to consideration of whether it is possible to exploit this fact to use high order extensions, and still have alphabets with a small number of source symbols.

To achieve that goal it is proposed to code the data in the 4×4 group with the following algorithm:
1. Find the maximum set number $N_m$ in the group of 4×4 pixels.
2. Entropy-code $N_m$; if $N_m=0$ stop.
3. If $N_m$ is small use an r-order source extension to entropy-code the 16/r groups of r pixels using a $(N_m+1)^r$ number alphabet; otherwise entropy-code the 16 pixel values with a $(N_m+1)$ symbol alphabet.
4. Stop.

The stop conditions are defined at the moment that all values can be known by the decoder. For instance, if the maximum $N_m$ is zero then it can be concluded that all 16 pixel values are zero. So in step 2 the encoder stops, but note that the decoder has to set the corresponding values (set numbers) to zero.

This simple scheme is very effective because it allows the proper adaptive selection of source extension and alphabet-sizes, according to the value distribution in that part of the image.

Indeed, in practice the most common case should be $N_m=0$, followed by $N_m=1$, $N_m=2$, etc. Thus, if $N_m=1$ or $N_m=2$ it is possible, for example, to choose in step 3 of the algorithm r=4, and entropy code groups of 2×2 pixels using alphabets with 16 and 81 numbers, respectively. Similarly, if $N_m=4$ or $N_m=5$ r=2 can be chosen, and entropy code groups of 2×1 pixels using alphabets with respectively 16 and 25 numbers. The choice of the best extensions depends on several practical factors. For example, adaptive encoders with large alphabets take a long time to gather reliable estimates of the source probabilities, and thus may not be suitable when the image is small.

This entropy coding scheme has the following advantages.
1. In the most frequent situation the pixels in the 4×4 group are entropy coded with high-order extensions, which allows full exploiting of the statistical dependence between adjacent pixels.
2. With the extensions it is possible to get very good results with simple and fast codes, which may have codewords with an integer number of bits. Indeed, in this example it is possible to obtain rates as low as 1/16 bit/symbol even with Huffman codes.
3. Because different alphabets are used for different values of $N_m$, this corresponds to entropy-coding the values conditioned to $N_m$, which is a measure of the activity in that 4×4 region. This property is the same employed by classifying encoders.

The algorithm cannot be arbitrarily extended to code any group of n×n pixels because the overhead incurred by coding the maximum value $N_m$ (except when $N_m=0$) must also be considered. Here the region size (4×4) was chosen as a compromise between overhead versus the gains obtained with extension and by exploiting the expected similarity inside the group. For a larger group (e.g., 8×8) the relative overhead (per pixel) may become insignificant, but the coding process is less adaptive. The opposite happens when the group is small (e.g., 2×2).

The example below shows a modification which can be used for coding sets with a small number of samples.

Groups of 2×2 Image Pixels

Assuming the same conditions as in the example above, consider a more sophisticated scheme to code groups of 2×2 pixels. Note that it may still not be possible to use source extension directly, since it yields an alphabet with 65,536 symbols (i.e., $16^4$).

When the set of samples (pixels) is small, a coding scheme is proposed that is similar to the algorithm proposed in the previous example, but which reduces the overhead associated with coding the maximum values. The new algorithm is:
1. Find the maximum value $N_m$ in the group of 2×2 pixels.
2. Entropy-code $N_m$; if $N_m=0$ stop.
3. Create a binary "mask" $\mu$ with 4 bits, each bit corresponding to a pixel in the 2×2 group. Each bit is set to one if the pixel value is equal to $N_m$ and otherwise set to zero.
4. Entropy-code $\mu$ using a 15-number alphabet (the case $\mu=0$ never occurs). If $\mu=15$ (binary [1111]) or $N_m=1$ stop.
5. Let r be the number of pixels with values smaller than $N_m$. If $N_m$ is sufficiently small then aggregate the r symbols and entropy-code them with a $N_m^r$-number alphabet. Otherwise entropy-code each of the r values with a $N_m$-symbol alphabet.
6. Stop.

Again, the stop conditions are defined by the knowledge available to the decoder. Here, for example, when $\mu=15$ the decoder sets the four pixel values to $N_m$.

The overhead associated with coding the maximum value $N_m$ is minimized by the use of the binary mask because now only pixel values smaller than $N_m$ need to be entropy-coded.

Again, the fact that different alphabets have to be used in different cases (values of $N_m$ and $\mu$) yields entropy-coding strongly conditioned to the data of the adjacent pixels. The condition above is an integral part of the method, but other extensions may also be advantageous. For instance, $\mu$ is always coded using a 15-number alphabet, but it may be better to code it conditioned to $N_m$.

Numerical results show that compression does not degrade much if the n numbers are not aggregated in step 5. At the same time they show that the overhead of entropy-coding $N_m$ in step 2 can be still further reduced. In the next example a solution to this problem is presented.

Recursive Coding of Groups of $2n \times 2^n$ Image Pixels

Here the same basic algorithm proposed to code the group of 2×2 pixels is used. The difference is that coding is now done in an hierarchical and recursive manner. First the algorithm is used to code the maximum number in the group of $2^m \times 2^n$ pixels. Then a 4-bit mask is defined to indicate if the maximum in each of the four subgroups of $2^{n-1} \times 2^{n-1}$ pixels is equal to the maximum in the $2^n \times 2^n$ group. The mask is entropy-coded and later the maximum values in the four subgroups of $2^{n-1} \times 2^{n-1}$ pixels are also coded. This subdivision process is applied to code the values in gradually smaller blocks, until all the 2×2 subgroups are coded.

In other words, for the groups of $2^n \times 2^n$ pixels the same algorithm proposed to code the values in the 2×2 groups is used. The difference is that when n>1 the maximum values in the subgroups are coded, and when n=1 the actual pixel values are coded.

The following advantages of this extension of the coding method can be cited:

it allows exploiting the statistical similarity in larger regions;

extension alphabets with a small number of elements are automatically used in large regions where the values are uniformly small, extending the desired adaptive alphabet selection; and when there are large regions that have value 0, a single symbol can give information about a large number of pixels, allowing compression to rates much smaller than 1 bit/pixel, even when Huffman codes are used.

Spatial-Orientation Trees

The common features in the previous examples are:
1. define some sets of source numbers;
2. entropy code the maximum value in each of those sets;
3. partition each set into a certain number of subsets;
4. possibly entropy code a binary mask indicating where the maximum value is to be found in the subset; and
5. use the same basic algorithm to code the maximum in the subsets, until all single-sample values are coded.

Thus, there is a great deal of flexibility in choosing the sets of numbers, and in implementing the coding method.

When the image is transformed using a wavelet transformation to construct a multiresolution pyramid (see J. S. Woods, ed., *Subband Image Coding*, Kluwer Academic Publishers, Boston, Mass., 1991.) there is a statistical dependence between the transformed pixel magnitudes following the pixels in different levels of the pyramid, but corresponding to the same spatial location. This property is exploited in another set-partitioning scheme (see A. Said and W. A. Pearlman, "A new fast and efficient codec based on set partitioning in hierarchical trees", *IEEE Trans. on Circuits and Systems for Video Technology*, vol. 6, pp. 243–250, June 1996.). The same sets, and set partitioning rules defined in the referenced article can be used in this new method to entropy-code wavelet-transformed images. A main difference between the method presented therein and the method proposed here is that the first was designed for embedded coding, while here the methods can be directly applied to an already quantized, transformed image.

General Scheme

The more general coding scheme, described in detail above with reference to FIGS. 1–6, and the examples provided, is:

1. Order the source symbols according to their probabilities, with "0" representing the most common symbol, "1" the second most common, etc.
2. Partition the source symbols into a certain number of sets.
3. Create a list with the initial sets, and find the maximum symbol-value $N_m$ inside those sets and entropy-code those numbers.
4. For each set with $N_m>0$
   (a) remove the set from the list and divide it into n subsets;
   (b) entropy-code a binary "mask" with n bits (one for each subset) such that a bit is set to 1 if the maximum in that subset, $N_{ms}$ is equal to $N_m$ and otherwise set to 0;
   (c) if $N_m>1$ then entropy-code every $N_{ms}<N_m$, possibly aggregating them to create the proper source extensions;
   (d) add to the list of sets each subset with more than one element and with $N_{ms}>0$; and
5. If the set list is empty then stop; otherwise go to step 4.

The simplicity of the scheme presented herein does not make clear its power and sophistication. However, the approach was devised as a combination of coding methods, selected after extensive research, that enables simultaneously simple implementation, fast execution, and near optimal compression in a wide range of applications and data sources. Note that there is a great deal of freedom in the choice of the rules to partition the sets, the number of sets, the scheme to be used for entropy-coding the different type of data, etc. For instance, the binary "masks" are proposed for cases when the number of subsets is small. However, a direct implementation, like the one described in the first example can be employed. Also, in step 1 it is not always necessary to have the symbols strictly sorted. It may suffice to have the symbols partially sorted, according to some expected probabilities. (This avoids the effort of estimating the probabilities before or while coding.)

Figure 7:
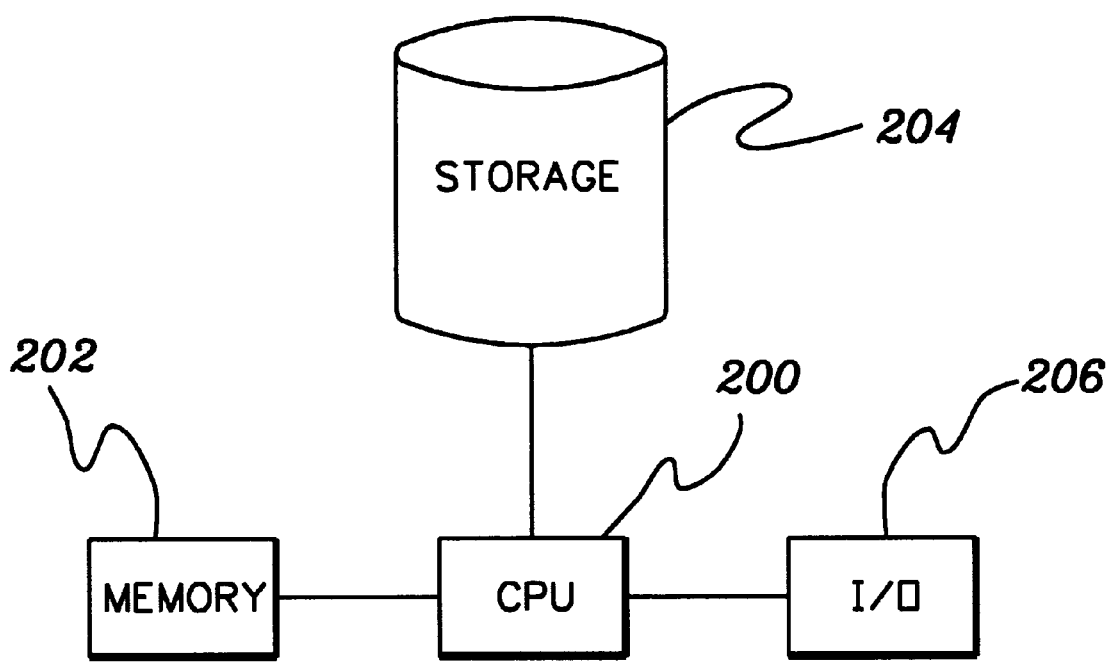
FIG. 7 is a block diagram of a computer system to employ data encoding and decoding in accordance with the present invention.

Hardware elements of a data compression system in accordance with the present invention are depicted in FIG. 7. The central processing unit ("CPU") 200 provides main processing functionality. A memory 202 is coupled to CPU 200 for providing operational storage of programs and data. Memory 202 may comprise, for example, random access memory ("RAM") or read-only memory ("ROM"). Non-volatile storage of, for example, data files and programs is provided by a storage 204 that may comprise, for example, disk storage. Both memory 202 and storage 204 comprise a computer usable medium that may store computer program products in the form of computer readable program code. User input and output can be provided by an input/output ("I/O") facility 206. I/O facility 206 may include, for example, a graphical display, a mouse and/or a graphics tablet. As an example, the compression system of FIG. 7 may comprise an International Business Machines RISC System/6000 computer executing an AIX operating system.

The present invention can be included in one or more computer program products comprising computer usable media, in which the media include computer readable program code means for providing and facilitating the mechanisms of the present invention. Products can be included as part of a computer system such as depicted in FIG. 7, or sold separately. One of ordinary skill in the art can readily implement the concepts presented based upon the disclosure set forth above.

Note from the above discussion that the present invention employs first transmitting the maximum value in a group because in the framework of the approach presented, knowledge of the maximum (given the reordering according to probability): (a) allows reduction of alphabet sizes, for more effective compression, with the most common cases being coded most efficiently; (b) the maximum is a good indicator for categorizing the distribution inside a group, yielding the desired adaptive selection according to the source characteristics; (c) it can be directly used later, as at least one value inside the group should be equal to the maximum; and (d) it is easy to compute. A coding method using the maximum value but not exploiting the properties above together would be less efficient.

Still another significant advantage of first coding the maximum value inside a group is that in the broad context defined by alphabet partitioning, this maximum value can be the maximum value of bits required to code the quantized values (or it may enable the identification of that number of bits). By knowing a priori, the number of bits required to efficiently code a set of numbers, it is possible to put together the bits according to significance for much more efficient manipulation.

For example, consider the four numbers, 0, 3, 2, and 1 to be coded, which originally used a byte for storage as shown in binary form below, with bytes separated by vertical lines.

|00000000|00000011|00000010|00000001|

From the knowledge of the maximum number $N_m$ in this group, it is known that only two bits are required to code each of the four values, with a total of eight bits. The encoder can send first the four least-significant bits together and then the remaining four bits. After receiving the least significant bits, the decoder can set those bits in four bytes simultaneously using a 32-bit computer word obtained by table look-up. For instance, since the four bits are 0101, the table entry would be

|00000000|00000001|00000000|00000001|

Further, since the next four bits are 0110, the next table entry to be used is

|00000000|00000001|00000001|00000000|

The decoder applies a left shift operation to the CPU register with the new table entry, followed by an OR operation with the previous content of the register, obtaining the four values

|00000000|00000011|00000011|00000001|

The advantage of this scheme comes from simultaneously setting several bits in few operations, exploiting the large register word length in modern computers. In the example above, the process is sped up to a factor of four by using 32-bit bit registers, and by a factor of eight using 64-bit registers. Furthermore, using groups of four or eight, it is easier to align the bits for transmission and/or storage in bytes, which is the format used universally. The technique above could not be exploited with the traditional method of entropy-coding the values separately (using codes like Huffman or arithmetic) because there is no prior knowledge of the number of bits to be encoded.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for compressing data, said method comprising:
    (a) employing probabilities to renumber a plurality of integer numbers representative of the data so that smaller numbers correspond to more probable integer numbers of said plurality of integer numbers and outputting a stream of numbers based upon said renumbering;
    (b) grouping said stream of numbers into at least two groups;
    (c) finding a maximum number ($N_m$) in a group from the at least two groups;
    (d) entropy-coding the maximum number $N_m$;
    (e) recursively encoding the numbers of the group using the maximum number $N_m$; and
    (f) repeating said steps (c)–(e) for each group of said at least two groups, thereby providing compressed data.

2. The method of claim 1, wherein said recursively encoding step (e) comprises:
    (i) partitioning the group of numbers into nonempty subgroups of numbers, and creating a subordinate group (S-group) list containing said subgroups;
    (ii) determining a maximum number in a subgroup;
    (iii) entropy-coding the maximum number in the subgroup with an ($N_m$+1) size alphabet; and
    (iv) repeating said steps (i)–(iii) for each subgroup in the S-group list.

3. The method of claim 2, wherein said repeating step (iv) includes determining whether the maximum number in the subgroup is zero and if so, selecting a next subgroup from the S-group list, and if the maximum number in the subgroup is greater than zero, determining whether the subgroup has only one constituent and if so, selecting a next subgroup from the S-group list.

4. The method of claim 1, further comprising alphabet partitioning the plurality of integer numbers into set numbers and set indices, and separating said set numbers and said set indices into two data streams, and wherein said renumber step (a) comprises employing probabilities to renumber said set numbers for encoding in steps (b)–(f) and outputting as codewords.

5. The method of claim 4, further comprising encoding said set indices in binary form, and wherein said method is in combination with a method for processing said codewords, said processing method comprising transmitting or storing said codewords and said set indices, and thereafter decoding said codewords by employing group-partitioning entropy-decoding.

6. The method of claim 5, wherein said group-partitioning entropy-decoding comprises receiving the codewords and entropy-decoding a maximum number $N_m$ of a group of codewords, then decoding the numbers in the group using the maximum number $N_m$.

7. The method of claim 6, further comprising recovering the plurality of integer numbers subsequent to decoding of the codewords by undoing the renumbering thereof of step (a).

8. The method of claim 7, further comprising subsequent to said undoing the renumbering thereof, recombining the set numbers and the set indices into a single data stream.

9. The method of claim 4, further comprising performing at least one of transformation and quantization on the plurality of integer numbers prior to said alphabet partitioning.

10. The method of claim 1, further comprising performing at least one of transformation and quantization on the plurality of integer numbers prior to said renumbering step (a).

11. The method of claim 1, wherein steps (a)–(f) produce codewords comprising said encoded plurality of integer numbers, and said method is further in combination with a method for processing said codewords, said method for processing said codewords comprising transmitting or storing said codewords, and thereafter decoding the codewords by employing group-partitioning entropy-decoding.

12. The method of claim 11, wherein said group-partitioning entropy-decoding comprises receiving the codewords and entropy-decoding a maximum number $N_m$ of a group of codewords, then decoding the numbers in the group using the maximum number $N_m$.

13. The method of claim 12, further comprising recovering the plurality of integers subsequent to decoding of the codewords by undoing the renumber thereof of step (a).

14. The method of claim 1, wherein said grouping step (b) comprises partitioning the stream of numbers into at least two groups of numbers defining regions of an image, ranges of time, or a linked list of data elements related by spatial, temporal or spatio-temporal dependence.

15. A method for compressing data, said method comprising:
(a) grouping a plurality of integer numbers representative of the data into at least two groups;
(b) establishing a group list containing said at least two groups;
(c) identifying a maximum integer number ($N_m$) within the at least two groups and entropy coding said maximum integer number ($N_m$);
(d) if $N_m>0$, then for each group in the group list
    (i) divide the group into n subgroups, wherein $n \geq 2$;
    (ii) create a binary mask of n bits, each bit said corresponding to one subgroup of said n subgroups and comprising 1 if the corresponding subgroup's maximum integer number ($N_{ms}$) equals the maximum integer number ($N_m$), otherwise the bit is 0;
    (iii) entropy coding the binary mask and entropy coding every subgroup maximum integer number ($N_{ms}$) which is less than the maximum integer number ($N_m$);
    (iv) add to the group list each subgroup with more than one integer number and a subgroup maximum integer number ($N_{ms}$)>0; and
(e) repeating said steps (c) & (d) for each group and subgroup in the group list until the group list is empty, thereby achieving encoding of said plurality of integer numbers and compressing of said data.

16. The method of claim 15, wherein said plurality of integer numbers comprise a plurality of set numbers, and wherein said method further comprises obtaining said plurality of set numbers by alphabet partitioning a stream of source numbers into alphabet set numbers and alphabet set indexes, said alphabet set numbers comprising said set numbers to be encoded.

17. The method of claim 16, further comprising ordering said plurality of set numbers according to assigned probabilities, wherein an alphabet set number "0" indexes a most common alphabet set, a "1" indexes a second most common alphabet set, etcetera.

18. The method of claim 15, wherein said grouping step (a) comprises partitioning the plurality of integer numbers into at least two groups defining regions of an image, ranges of time, or a linked list of data elements related by spatial, temporal or spatio-temporal dependence.

19. The method of claim 15, wherein said entropy coding (d) (iii) includes aggregating said subgroup maximum integer numbers ($N_{ms}$) to create an extension and entropy-coding said extension.

20. The method of claim 15, wherein said entropy-codings of steps (c) & (d) produce codewords, and wherein said method is further in combination with a method for processing said codewords, said processing method comprising transmitting or storing said codewords, and thereafter decoding said codewords by employing group-partitioning entropy-decoding.

21. The method of claim 20, wherein said group-partitioning entropy-decoding comprises receiving the codewords and entropy-decoding a maximum number $N_m$ of a group of codewords, then decoding the integer numbers in the group using the maximum number $N_m$.

22. The method of claim 21, wherein said method further comprises obtaining said plurality of integer numbers by employing probabilities to renumber a plurality of source numbers so that smaller integer numbers correspond to more probable source numbers.

23. An encoder for encoding a plurality of integer numbers comprising:
(a) means for renumbering the plurality of integer numbers so that smaller numbers correspond to more probable integer numbers, and for outputting a stream of numbers based thereon;
(b) means for grouping the stream of numbers into at least two groups;
(c) means for finding a maximum number $N_m$ in a group from the at least two groups; (d) means for entropy-coding the maximum number $N_m$;
(e) means for recursively encoding the group of numbers using the maximum number $N_m$; and
(f) means for repeating, for each group of the at least two groups, said means for finding (c), said means for entropy-coding (d) and said means for recursively encoding (e), thereby producing codewords comprising said encoded plurality of integer numbers.

24. The encoder of claim 23, wherein said means for recursively encoding (e) comprises:
(i) means for partitioning the group of numbers into nonempty subgroups of numbers, and for creating a subordinate group (S-group) list containing said subgroups;
(ii) means for determining a maximum number ($N_m$) in a subgroup from the S-group list;
(iii) means for entropy-coding the maximum number in the subgroup with an ($N_m$+1) size alphabet; and
(iv) means for repeating processing of said means for partitioning (i), said means for determining (ii), and said means for entropy-coding (iii) for each subgroup in the S-group list.

25. The encoder of claim 24, wherein said means for repeating said means for partitioning (i), said means for determining (ii), and said means for entropy-coding (iii) comprises means for selecting a next subgroup in the S-group list if the maximum number in a current subgroup is zero or if the current subgroup has only one constituent.

26. The encoder of claim 23, further comprising means for alphabet partitioning the plurality of integer numbers into set numbers and set indices, and for separating said set numbers and said set indices into two data streams, wherein said means for renumbering (a) comprises means for employing probabilities to renumber said set numbers.

27. The encoder of claim 23, further comprising means for performing at least one of transformation and quantization on the plurality of integer numbers before renumbering by said means for renumbering.

28. The encoder of claim 23, wherein said means for grouping comprises means for partitioning a stream of numbers into at least two groups of numbers defining regions of an image, ranges of time, or a linked list of data elements related by spatial, temporal or spatio-temporal dependence.

29. The encoder of claim 23, wherein said means for recursively encoding (e) comprises:

(i) means for partitioning the group of numbers into n nonempty subgroups of numbers, and for creating a subordinate group (S-group) list containing said subgroups;

(ii) means for employing a binary mask of n bits, each bit corresponding to one subgroup of said n subgroups and comprising 1 if the corresponding subgroup's maximum integer number ($N_{ms}$) equals the maximum integer number ($N_m$), otherwise the bit is 0;

(iii) means for entropy-coding the binary mask and entropy-coding every subgroup maximum integer number ($N_{ms}$) which is less than the maximum integer number ($N_m$); and (iv) means for adding to the group list each subgroup with more than one integer number in a subgroup maximum integer number ($N_{ms}$)>0.

30. A decoder for decoding codewords produced by the encoder of claim 23, said decoder comprising:

means for receiving said codewords;

means for entropy-decoding a maximum number $N_m$ of a group of numbers represented by the codewords;

means for decoding integer numbers in the group using the maximum number $N_m$; and means for repeating for each group of numbers represented by the codewords, said entropy-decoding of a maximum number of the group and said decoding of the integer numbers in the group using the maximum number $N_m$.

31. The decoder of claim 30, further comprising means for recovering the plurality of integer numbers subsequent to decoding of said codewords by undoing the renumbering thereof of said encoder.

32. The decoder of claim 31, wherein said codewords represent encoded set numbers and said means for receiving further comprises means for receiving a separate stream of set indices, and wherein said decoder further comprises means for recombining decoded set numbers and said set indices into a single data stream.

33. The decoder of claim 32, wherein said received codewords comprise encoded transformed data, and wherein said decoder further comprises means for inverse transforming said single data stream to obtain the plurality of integer numbers.

34. A computer system for processing source integer numbers comprising:

an encoder for encoding said source integer numbers to produce codewords;

a transmission/storage subsystem for accommodating said codewords;

a decoder for receiving said codewords from said transmission/storage subsystem and for decoding said codewords to reobtain said source integer numbers; and wherein said encoder comprises:

(i) means for renumbering the source numbers so that smaller numbers correspond to more probable source numbers and for outputting a stream of numbers based thereon;

(ii) partition means for grouping said stream of numbers into at least two groups;

(iii) means for finding a maximum number ($N_m$) in a group of numbers from the at least two groups;

(iv) means for entropy-coding the maximum number $N_m$;

(v) means for recursively encoding the group of numbers using the maximum number $N_m$; and (vi) means for repeating said means (iii)–(v).

35. The computer system of claim 34, wherein said means for recursively encoding (v) comprises:

(vii) means for partitioning the group of numbers into nonempty subgroups of numbers, and for creating a subordinate group (S-group) list containing said subgroups;

(viii) means for determining a maximum number in a subgroup;

(ix) means for entropy-coding the maximum number in the subgroup with an ($N_m$+1) size alphabet; and (x) means for repeating said means for partitioning the group into nonempty subgroups (vii), said means for determining (viii), and said means for entropy-coding (ix) for each subgroup in the S-group list.

36. The computer system of claim 35, further comprising means for alphabet partitioning the source integer numbers into set numbers and set indices, and for separating said set numbers and said set indices into two data streams, and wherein said means (i)–(vi) comprise means for encoding said set numbers to produce said codewords.

37. The computer of claim 35, wherein said decoder comprises means for group-partitioning entropy-decoding a maximum number $N_m$ of a group of codewords, and then for decoding the numbers in the group using the maximum number $N_m$.

38. The computer system of claim 37, wherein said decoder further comprises means for recovering the source integer numbers subsequent to decoding of the codewords, said means for recovering comprising means for undoing the renumbering of the source integer numbers by said means for renumbering (i) of said encoder.

39. A computer program product comprising a computer usable medium having computer readable program code means therein for use in compressing data in a computer system, said computer readable program code means in said computer program product comprising:

(i) computer readable program code means for renumbering a plurality of integer numbers representative of the data employing associated probabilities so that smaller numbers correspond to more probable integer numbers of said plurality of integer numbers and for outputting a stream of numbers based upon said renumbering;

(ii) computer readable code means for grouping said stream of numbers into at least two groups;

(iii) computer readable code means for finding a maximum number ($N_m$) in a group from the at least two groups;

(iv) computer readable code means for entropy-coding the maximum number $N_m$;

(v) computer readable program code means for recursively encoding the numbers of the group using the maximum number $N_m$; and (vi) computer readable program code means for repeating processings of said computer readable code means (i)–(iv) for each group of the at least two groups.

40. The computer readable program code means of claim 39, further comprising computer readable program code means for alphabet partitioning the plurality of integer numbers into set numbers and set indices, and for separating said set numbers and said set indices into two data streams, and wherein said computer readable program code means (i) comprises computer readable code means for renumbering the set numbers for encoding by said computer readable program code means (ii)–(vi).

41. The computer readable program code means of claim 39, wherein said computer readable program code means (ii) comprises computer readable program code means for partitioning the stream of numbers into at least two groups of numbers defining regions of an image, ranges of time, or a linked list of data elements related by spatial, temporal or spatio-temporal dependence.

* * * * *

UNITED STATES PATENT AND TRADEMARK OFFICE
CERTIFICATE OF CORRECTION

PATENT NO. : 5,959,560
DATED : September 28, 1999
INVENTOR(S) : Said et al.

It is certified that error appears in the above-identified patent and that said Letters Patent is hereby corrected as shown below:

Col. 17, line 18, delete "$2^m \times 2^n$" and replace with --$2^n \times 2^n$--.

Signed and Sealed this

Sixteenth Day of May, 2000

Attest:

Q. TODD DICKINSON

*Attesting Officer*     *Director of Patents and Trademarks*